US006954494B2

(12) United States Patent
Rickard et al.

(10) Patent No.: US 6,954,494 B2
(45) Date of Patent: Oct. 11, 2005

(54) ONLINE BLIND SOURCE SEPARATION

(75) Inventors: Scott Rickard, Princeton, NJ (US); Radu Victor Balan, Levitown, PA (US); Justinian Rosca, Princeton, NJ (US)

(73) Assignee: Siemens Corporate Research, Inc., Princeton, NJ (US)

( * ) Notice: Subject to any disclaimer, the term of this patent is extended or adjusted under 35 U.S.C. 154(b) by 866 days.

(21) Appl. No.: 10/027,964

(22) Filed: Oct. 25, 2001

(65) Prior Publication Data

US 2003/0103561 A1 Jun. 5, 2003

(51) Int. Cl.[7] .............................. H03H 7/30; H03H 7/40; H03K 5/159
(52) U.S. Cl. ........................ 375/232; 375/350; 375/285; 375/316
(58) Field of Search ................................ 375/232, 350, 375/285, 316; 708/323

(56) References Cited

U.S. PATENT DOCUMENTS

| | | | | |
|---|---|---|---|---|
| 5,694,474 A | * | 12/1997 | Ngo et al. | 381/66 |
| 5,706,402 A | * | 1/1998 | Bell | 706/22 |
| 5,999,567 A | * | 12/1999 | Torkkola | 375/232 |
| 6,240,098 B1 | * | 5/2001 | Thibault et al. | 370/431 |
| 6,317,703 B1 | | 11/2001 | Linsker | 702/190 |
| 6,430,528 B1 | * | 8/2002 | Jourjine et al. | 704/200 |
| 6,697,633 B1 | * | 2/2004 | Dogan et al. | 455/509 |
| 6,704,369 B1 | * | 3/2004 | Kawasaki et al. | 375/285 |
| 2001/0016691 A1 | * | 8/2001 | Tamura et al. | 600/485 |

OTHER PUBLICATIONS

DOA estimation of many W–disjoint orthogonal sources from two mixtures using DUET Rickard, S. Dietrich, F. Princeton Univ NJ, USA; Statistical Signal and Array Processing, 2000. Proceedings of the Tenth IEEE Workshop Publication Date: Aug. 14–16, 2.*

Acoustic Propagation in Surface Ducts Using the Radiation Transport Equation Wilson, H. Tappert, F. Science Applications, Inc., La Jolla, CA, USA "OCEANS" Publication Date: Sep. 1979 vol.: 11 On pp.: 84–91.*

A fast blind source separation for digital wireless applications Toriak, M.; Hansen, L.K.; Xu, G.; Acoustics, Speech, and Signal Processing, 1998. ICASSP '98. Proceedings of the 1998 IEEE International Conference on vol. 6, May 12–15, 1998 pp.: 3305.*

(Continued)

Primary Examiner—Stephen Chin
Assistant Examiner—Harry Vartanian
(74) Attorney, Agent, or Firm—Donald B. Paschburg; F. Chau & Associates, LLC

(57) ABSTRACT

A method for blind source separation of sources detects the sources using sensors to obtain representative data. The data is then represented by two mixtures having estimates of amplitude and delay mixing parameters. The estimates are updated, including: calculating error measures, each indicating a closeness of the estimates for a given source to a given time-frequency point in the mixtures; and revising the estimates, based on the error measures. The mixtures are filtered to obtain estimates of the sources, including: selecting one error measure having a smallest value in relation to any other error measures, for each time-frequency point in the mixtures; and leaving unaltered any time-frequency points for which a given error measure has the smallest value, while setting to zero any other time-frequency points for which the given error measure does not have the smallest value, for each error measure. The estimates of the sources are output.

21 Claims, 10 Drawing Sheets

OTHER PUBLICATIONS

Blind–ML scheme for blind source separation Lomnitz, Y.; Yeredor, A.; Statistical Signal Processing, 2003 IEEE Workshop o Sep. 28–Oct. 1, 2003 pp.: 581–584.*

Blind source separation by dynamic graphical modelsAttias, H.;Artificial Neural Networks, 1999. ICANN 99. Ninth International Conference on (Conf. Publ. No. 470)vol. 1, Sep. 7–10, 1999 pp.: 126–131 vol. 1.*

Blind separation of speech mixtures via time–frequency masking Yilmaz, O.; Rickard, S.; Signal Processing, IEEE Transactions on [see also Acoustics, Speech, and Signal processing, IEEE Transactions on] vol. 52, Issue 7, Jul. 2004 pp.: 1830–1847.*

On the approximate W–disjoint orthogonality of speech Rickard, S.; Yilmaz, Z.; Acoustics, Speech, and Signal Processing, 2002. Proceedings. (ICASSP '02). IEEE International Conference on vol. 1, May 13–17, 2002 pp.: I–529—I–532 vol. 1.*

Blind separation of disjoint orthogonal signals: demixing N sources from 2 mixtures Jourjine, A.; Rickard, S.; Yilmaz, O.; Acoustics, Speech, and Signal Processing, 2000. ICASSP '00. Proceedings. 2000 IEEE International Conference on vol. 5, Jun. 5–9, 20.*

* cited by examiner

ONLINE BLIND SOURCE SEPARATION

BACKGROUND

1. Technical Field

The present invention generally relates to separating signal sources and, in particular, to online blind separation of multiple sources.

2. Background Description

The separation of independent sources from an array of sensors is a classic but difficult problem in signal processing. Generally, the signal sources as well as their mixture characteristics are unknown. Without knowledge of the signal sources, other than a general assumption that the sources are independent, the signal processing is commonly known in the art as the "blind separation of sources". The separation is "blind" because nothing is assumed about the independent source signals, nor about the mixing process.

A typical example of the blind separation of source signals is where the source signals are sounds generated by two independent sources, such as two (or more) separate speakers. An equal number of microphones (two in this example) are used to produce mixed signals, each composed as a weighted sum of the source signals. Each of the source signals is delayed and attenuated in some unknown amount during passage from the speaker to a microphone, where it is mixed with the delayed and attenuated components of the other source signals. Multi-path signals, generated by multiple reflections of the source signals, are further mixed with direct source signals. This is generally known as the "cocktail party" problem, since a person generally wishes to listen to a single sound source while filtering out other interfering sources, including multi-path signals.

According to the prior art, a blind source separation technique that allows the separation of an arbitrary number of sources from just two mixtures provided the time-frequency representations of sources do not overlap is described by Jourjine et al., in "Blind Separation of Disjoint Orthogonal Signals: Demixing N Sources from 2 Mixtures", in Proceedings of the 2000 IEEE International Conference on Acoustics, Speech, and Signal Processing, Istanbul, Turkey, June 2000, vol. 5, pp. 2985–88, June 2000. This technique is hereinafter referred to as the "original DUET algorithm". The key observation in the technique is that, for mixtures of such sources, each time-frequency point depends on at most one source and its associated mixing parameters. In anechoic environments, it is possible to extract the estimates of the mixing parameters from the ratio of the time-frequency representations of the mixtures. These estimates cluster around the true mixing parameters and, identifying the clusters, one can partition the time-frequency representation of the mixtures to provide the time-frequency representations of the original sources.

The original DUET algorithm involved creating a two-dimensional (weighted) histogram of the relative amplitude and delay estimates, finding the peaks in the histogram, and then associating each time-frequency point in the mixture with one peak. The original implementation of the method was offline and passed through the data twice; one time to create the histogram and a second time to demix.

Accordingly, it would be desirable and highly advantageous to have an online method for performing blind source separation of multiple sources. Moreover, it would be further desirable and highly advantageous to have such a method that does not require the creation and updating of a histogram or the locating of peaks in the histogram.

SUMMARY OF THE INVENTION

The problems stated above, as well as other related problems of the prior art, are solved by the present invention, a method for online blind separation of multiple sources.

The present invention provides an online version of the DUET algorithm that avoids the need for the creation of the histogram, which in turn avoids the computational load of updating the histogram and the tricky issue of finding and tracking peaks. The advantages of the present invention over the prior art, in particular, the original DUET algorithm include: online (5 times faster than real time); 15 dB average separation for anechoic mixtures; 5 dB average separation for echoic mixtures; and can demix two or more sources from 2 mixtures.

According to an aspect of the present invention, there is provided a method for blind source separation of multiple sources. The multiple sources are detected using an array of sensors to obtain data representative of the multiple sources. The data is represented by two mixtures having estimates of amplitude and delay mixing parameters. The estimates of amplitude and delay mixing parameters are updated, comprising the steps of: calculating a plurality of error measures, each of the plurality of error measures indicating a closeness of the estimates of amplitude and delay mixing parameters for a given source to a given time-frequency point in the two mixtures; and revising the estimates of amplitude and delay mixing parameters, based on the plurality of error measures. The two mixtures are filtered to obtain estimates of the multiple sources, comprising the steps of: selecting one of the plurality of error measures having a smallest value in relation to any other of the plurality of error measures, for each of a plurality of time-frequency points in the mixtures; and leaving unaltered any of the plurality of time-frequency points in the mixtures for which a given one of the plurality of error measures has the smallest value, while setting to zero any other of the plurality of time-frequency points in the mixtures for which the given one of the plurality of error measures does not have the smallest value, for each of the plurality of error measures. The estimates of the multiple sources are output.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to online blind separation of multiple sources. It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a a combination thereof) that is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Figure 1:
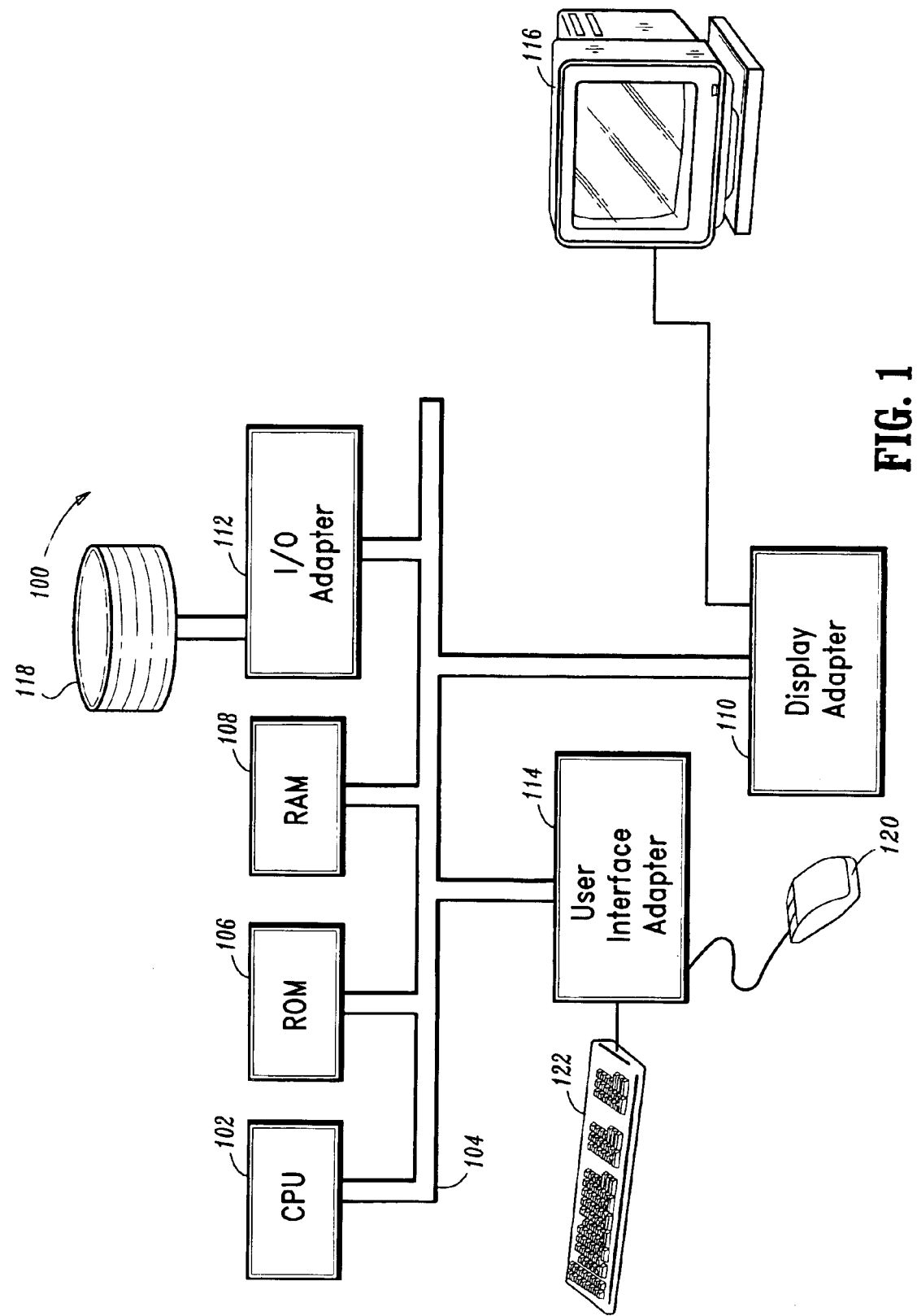
FIG. 1 is a block diagram of a computer processing system 100 to which the present invention may be applied according to an illustrative embodiment thereof.

FIG. 1 is a block diagram of a computer processing system 100 to which the present invention may be applied according to an illustrative embodiment thereof. The computer processing system 100 includes at least one processor (CPU) 102 operatively coupled to other components via a system bus 104. A read only memory (ROM) 106, a random access memory (RAM) 108, a display adapter 110, an I/O adapter 112, and a user interface adapter 114 are operatively coupled to the system bus 104.

A display device 116 is operatively coupled to the system bus 104 by the display adapter 110. A disk storage device (e.g., a magnetic or optical disk storage device) 118 is operatively coupled to the system bus 104 by the I/O adapter 112.

A mouse 120 and keyboard 122 are operatively coupled to the system bus 104 by the user interface adapter 114. The mouse 120 and keyboard 122 may be used to input/output information to/from the computer processing system 100.

The present invention will now be described generally with respect to FIGS. 2–6. Subsequent thereto, more detailed descriptions of various aspects of the present invention are provided. It is to be noted that while any equations provided with respect to FIGS. 2–6 may be so provided out of order; however, in the subsequent detailed description, the equations and corresponding text are provided sequentially in order of performance according to a preferred embodiment of the present invention. Given the teachings of the present invention provided herein, one of ordinary skill in the related art will readily contemplate variations of the sequence and actual details of the equations and corresponding steps described herein while maintaining the spirit and scope of the present invention.

Figure 2:
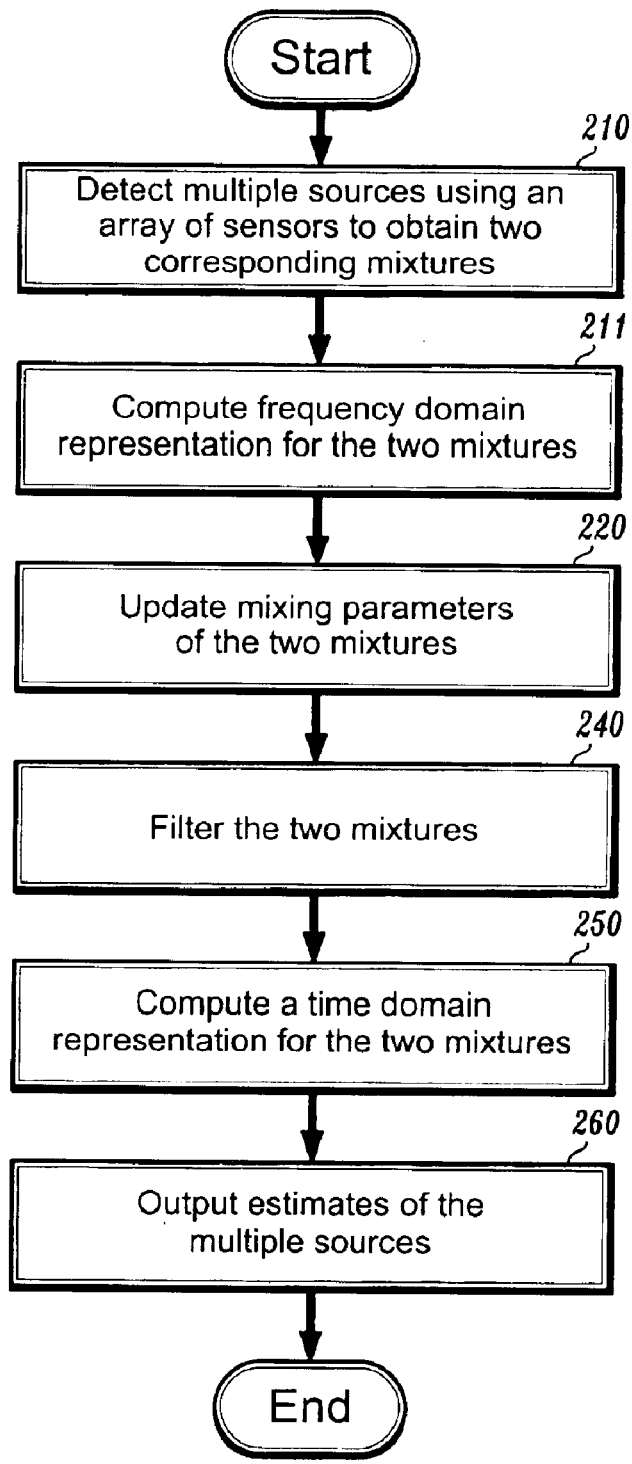
FIG. 2 is a flow diagram illustrating a method for blind source separation of multiple sources, according to an illustrative embodiment of the present invention.

FIG. 2 is a flow diagram illustrating a method for blind source separation of multiple sources, according to an illustrative embodiment of the present invention. The multiple sources are detected using an array of sensors to obtain two mixtures corresponding to the multiple sources (step 210). A frequency domain representation is computed for the two mixtures (step 211).

Subsequent to step 211, the method proceeds to step 220 to update mixing parameters of the two mixtures, and the the method proceeds to step 240 and filters the two mixtures.

Subsequent to step 240, a time domain representation is computed for the two mixtures (step 250). Estimates of the (original) multiple sources are output (step 260).

It is to be appreciated that the steps directed to computing the time domain and frequency domain representations (steps 250 and 211, respectively) are readily performed by one of ordinary skill in the related art. Nonetheless, for further detail on such computations, the reader is referred to Deller et al., "Discrete-Time Processing of Speech Signals", IEEE Press, pubs., 2000. The other steps are described in further detail below with respect to FIGS. 3–6.

Figure 3:
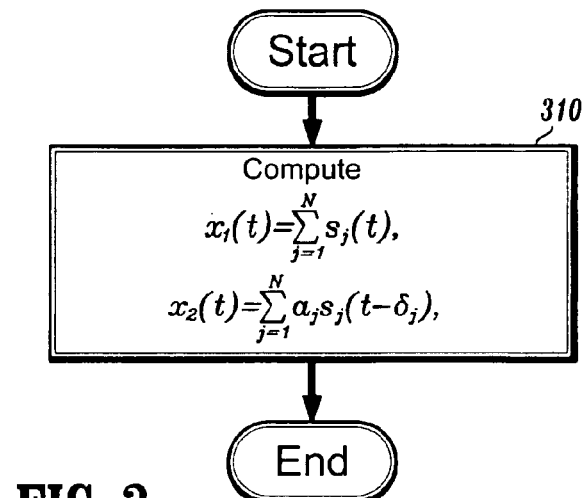
FIG. 3 is a flow diagram illustrating step 210 of the method of FIG. 2, according to an illustrative embodiment of the present invention.

FIG. 3 is a flow diagram illustrating step 210 (obtain mixtures) of the method of FIG. 2, according to an illustrative embodiment of the present invention. The multiple sources to be separated are mixed to obtain two mixtures x1, x2 (step 310), expressed as follows:

$$x_1(t) = \sum_{j=1}^{N} s_j(t), \tag{1}$$

$$x_2(t) = \sum_{j=1}^{N} a_j s_j(t - \delta_j), \tag{2}$$

where N is a number of the multiple sources; $\delta_j$ is an arrival delay between the array of sensors resulting from an angle of arrival; $\alpha_j$ is a relative attenuation factor corresponding to a ratio of attenuations of paths between the multiple sources and the array of sensors; $s_j(t)$ is a $j^{th}$ source; j is a source index ranging from 1 to N, where N is a number of the multiple sources; and t is a time argument. We use $\Delta$ to denote the maximal possible delay between sensors, and thus, $|\delta_j| \leq \Delta$, $\forall j$.

It is to be appreciated that an "array of sensors" is referred to herein with respect to detecting multiple sources. The array of sensors may include 2 (a pair) or more sensors.

Figure 4:
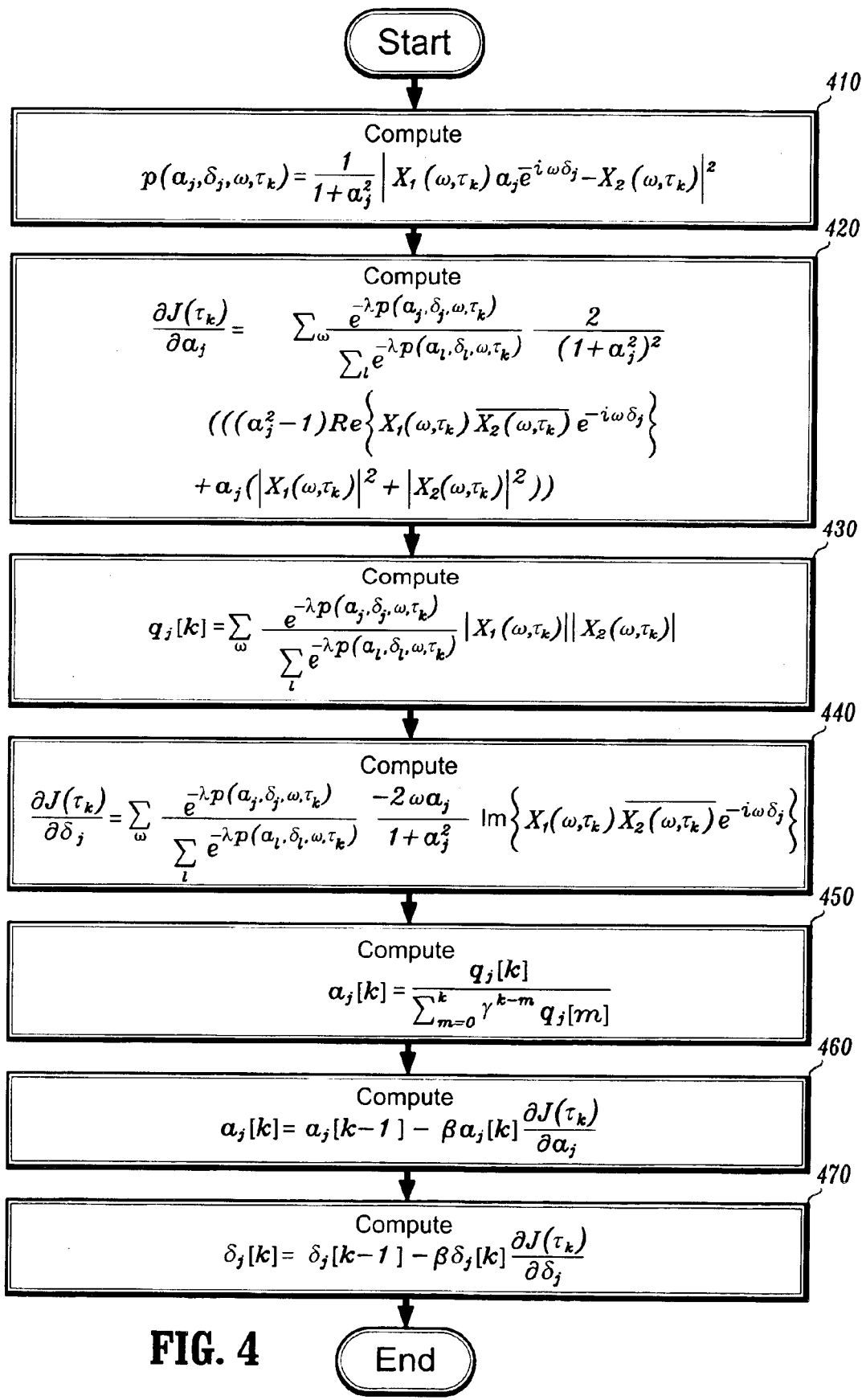
FIG. 4 is a flow diagram illustrating step 240 of the method of FIG. 2, according to an illustrative embodiment of the present invention.

FIG. 4 is a flow diagram illustrating step 240 (update mixing parameters) of the method of FIG. 2, according to an illustrative embodiment of the present invention. In general, the method of FIG. 4 updates the amplitude and delay estimates so that they better explain the measured data. The input information to the method is the time-frequency representations of the mixtures.

Upon receiving the $k^{th}$ block of data corresponding to the frequency domain representation of a window of data centered at $\tau_k = k\tau_\Delta$ where $\tau_\Delta$ is the time separating adjacent windows of the first mixture $x_1$ and the second mixture $x_2$, $p(\alpha_j, \delta_j, \omega, \tau_k)$, which represents a distance measure for how well the current guesses as to what are the mixing parameters of the multiple sources are in light of the current data, is computed for each $j=1, \ldots, N$ as follows (step 410):

$$p(a_j, \delta_j, \omega, \tau_k) = \frac{1}{1+a_j^2} |X_1(\omega, \tau_k) a_j e^{-i\omega\delta_j} - X_2(\omega, \tau_k)|^2 \quad (10)$$

where $\alpha_j$ and $\delta_j$ are current estimates of amplitude and delay mixing parameters, respectively; $X_1(\omega, \tau_k)$ and $X_2(\omega, \tau_k)$ are time-frequency representations of a first mixture and a second mixture of the two mixtures, respectively; k is a current time index; $\tau_k$ is a time argument corresponding to a $k^{th}$ time index; $\omega$ is a frequency argument; and j is a source index ranging from 1 to N, where N is a number of the multiple sources.

It is to be appreciated that $p(\alpha_j, \delta_j, \omega, \tau_k)$ is an error measure that calculates how much a given time-frequency point in the mixtures is explained by a particular guess of the $j^{th}$ source's mixing parameters. The closer that $p(\alpha_j, \delta_j, \omega, \tau_k)$ is to zero, the better it explains the time-frequency content of the mixtures, and the more likely the particular guess is the correct guess.

It is to be noted that each $p(\alpha_j, \delta_j, \omega, \tau_k)$ term (wherein $j=1, \ldots, N$) depends on $\alpha_j$ and $\delta_j$, the current estimates of the relative amplitude and delay parameters, respectively. Moreover, each $p(\alpha_j, \delta_j, \omega, \tau_k)$ term measures a distance assessing how well the data matches the $j^{th}$ mixing parameter estimate. The smaller the distance, the better the $j^{th}$ pair of mixing parameters explains the corresponding time-frequency point in the mixtures. The $p(\alpha_j, \delta_j, \omega, \tau_k)$ play an important role in the updating of the amplitude and delay estimates, both of which are computed in two steps. First, we estimate by how much and in which direction we should change each estimate, this is the calculation in Equations (19) and (18) for amplitude and delay, respectively. The better the data is explained by a given amplitude-delay estimate, the larger the effect of that data on the resulting change calculation. Second, the new amplitude and delay estimates are calculated via Equations (20) and (21), respectively. The direction of the change has been calculated in Equations (19) and (18) and the magnitude of the change is scaled by a learning rate constant beta and a variable learning rate calculated using Equations (22) and (23). The variable learning rate is calculated such that estimates that are explaining more data that they previously did have a higher learning rate and estimates that are explaining less data that they previously did have a lower learning rate. Estimates that explain roughly the same amount of data over time (that is, not an increasing or decreasing amount) have roughly a constant learning rate.

Upon computing $p(\alpha_j, \delta_j, \omega, \tau_k)$, the following are computed $$\frac{\partial J(\tau_k)}{\partial a_j} \text{ (step 420)}, \quad q_j[k] \text{ (step 430)}, \quad \text{and} \quad \frac{\partial J(\tau_k)}{\partial \delta_j} \text{ (step 440)}.$$

$$\frac{\partial J(\tau_k)}{\partial a_j},$$

which represents the direction and magnitude of change in the current estimate of the $j^{th}$ source's amplitude mixing parameter causing the greatest change in how well the amplitude estimate describes (corresponds to) the data, is computed as follows (step 420):

$$\frac{\partial J(\tau_k)}{\partial a_j} = \sum_\omega \frac{e^{-\lambda p(a_j,\delta_j,\omega,\tau_k)}}{\sum_l e^{-\lambda p(a_l,\delta_l,\omega,\tau_k)}} \frac{2}{(1+a_j^2)^2} \quad (19)$$

$$(((a_j^2 - 1)\text{Re}\{X_1(\omega, \tau_k)\overline{X_2(\omega, \tau_k)}e^{-i\omega\delta_j}\} +$$

$$a_j(|X_1(\omega, \tau_k)|^2 + |X_2(\omega, \tau_k)|^2))$$

where k is a current time index; $\tau_k$ is a time argument corresponding to a $k^{th}$ time index; $\alpha_j$ is the current estimate of amplitude mixing parameter for the $j^{th}$ source; $\delta_j$ is a current estimate of amplitude mixing parameter for the $j^{th}$ source; $X_1(\omega, \tau_k)$ and $X_2(\omega, \tau_k)$ are time-frequency representations of a first mixture and a second mixture of the two mixtures, respectively; $\omega$ is a frequency argument; j and l are source indexes ranging from 1 to N, where N is a number of the multiple sources; $p(\alpha_j, \delta_j, \omega, \tau_k)$ is an error measure for the $j^{th}$ source; $\lambda$ is a smoothness parameter; and Re is a function that returns a real part of a complex number.

$q_j[k]$, which represents the amount of mixture energy which is explained (defined) by the $j^{th}$ source's amplitude and delay mixing parameters, is computed as follows (step 430):

$$q_j[k] = \sum_\omega \frac{e^{-\lambda p(a_j,\delta_j,\omega,\tau_k)}}{\sum_l e^{-\lambda p(a_l,\delta_l,\omega,\tau_k)}} |X_1(\omega, \tau_k)| \, |X_2(\omega, \tau_k)| \quad (22)$$

where k is a current time index; $\tau_k$ is a time argument corresponding to a $k^{th}$ time index; $\alpha_j$ and $\delta_j$ are current estimates of amplitude and delay mixing parameters, respectively for the $j^{th}$ source; $X_1(\omega, \tau_k)$ and $X_2(\omega, \tau_k)$ are time-frequency representations of a first mixture and a second mixture of the two mixtures, respectively; $\omega$ is a frequency argument; j and l are source indexes ranging from 1 to N, where N is a number of the multiple sources; and $\lambda$ is a smoothness parameter.

$$\frac{\partial J(\tau_k)}{\partial \delta_j},$$

which represents the direction and magnitude of change in the current estimate of the $j^{th}$ source's delay parameter causing the greatest change in how well the delay estimate describes (corresponds to) the data, is computed as follows (step 440):

$$\frac{\partial J(\tau_k)}{\partial \delta_j} = \sum_\omega \frac{e^{-\lambda p(a_j,\delta_j,\omega,\tau_k)}}{\sum_l e^{-\lambda p(a_l,\delta_l,\omega,\tau_k)}} \frac{-2\omega a_j}{1+a_j^2} \text{Im}\{X_1(\omega,\tau_k)\overline{X_2(\omega,\tau_k)}e^{-i\omega\delta_j}\} \quad (18)$$

where k is a current time index; $\tau_k$ is a time argument corresponding to a $k^{th}$ time index; $\alpha_j$ is a current estimate of amplitude mixing parameter for the $j^{th}$ source; $\delta_j$ is the current estimate of delay mixing parameter for the $j^{th}$ source; $X_1(\omega,\tau_k)$ and $X_2(\omega,\tau_k)$ are time-frequency representations of a first mixture and a second mixture of the two mixtures, respectively; $\omega$ is a frequency argument; j and l are source indexes ranging from 1 to N, where N is a number of the multiple sources; $p(\alpha_j,\delta_j,\omega,\tau_k)$ is an error measure for the $j^{th}$ source; $\lambda$ is a smoothness parameter; and Im is a function that returns an imaginary part of a complex number.

Subsequent to step 430, $\alpha_j[k]$, which represents the time dependent parameter (variable) learning rate, is computed as follows (step 450):

$$\alpha_j[k] = \frac{q_j[k]}{\sum_{m=0}^{k} \gamma^{k-m} q_j[m]} \quad (23)$$

where $q_j[k]$ represents an amount of mixture energy that is defined by estimates of amplitude and delay mixing parameters for a $j^{th}$ source; $\gamma$ is a forgetting factor; m is a time index ranging from 0 to a current time index k; and j is a source index ranging from 1 to N, where N is a number of the multiple sources.

Upon computing $$\frac{\partial J(\tau_k)}{\partial a_j} \text{ and } \alpha_j[k],$$

mixing parameter estimate $\alpha_j[k]$ is updated as follows (step 460):

$$a_j[k] = a_j[k-1] - \beta a_j[k]\frac{\partial J(\tau_k)}{\partial a_j} \quad (20)$$

Upon computing $$\frac{\partial J(\tau_k)}{\partial \delta_j} \text{ and } \alpha_j[k],$$

mixing parameter estimate $\delta_j[k]$ is updated as follows (step 470):

$$\delta_j[k] = \delta_j[k-1] - \beta\delta_j[k]\frac{\partial J(\tau_k)}{\partial \delta_j} \quad (21)$$

where, for steps 460 and 470, $a_j[k]$ and $\delta_j[k]$ are the estimates of amplitude and delay mixing parameters for a $j^{th}$ source at a time index k, respectively; $\beta$ is a learning rate constant;

$$\frac{\partial J(\tau_k)}{\partial a_j}$$

represents the magnitude and the direction of change in a current estimate of amplitude mixing parameter for a $j^{th}$ source that causes a largest change in correspondence between the current estimate and the data;

$$\frac{\partial J(\tau_k)}{\partial \delta_j}$$

represents the magnitude and the direction of change in a current estimate of delay mixing parameter for a $j^{th}$ source that causes a largest change in correspondence between the current estimate and the data; $\tau_k$ is a current time; k is a current time index; and j is a source index ranging from 1 to N, wherein N is a number of the multiple sources.

Figure 5:
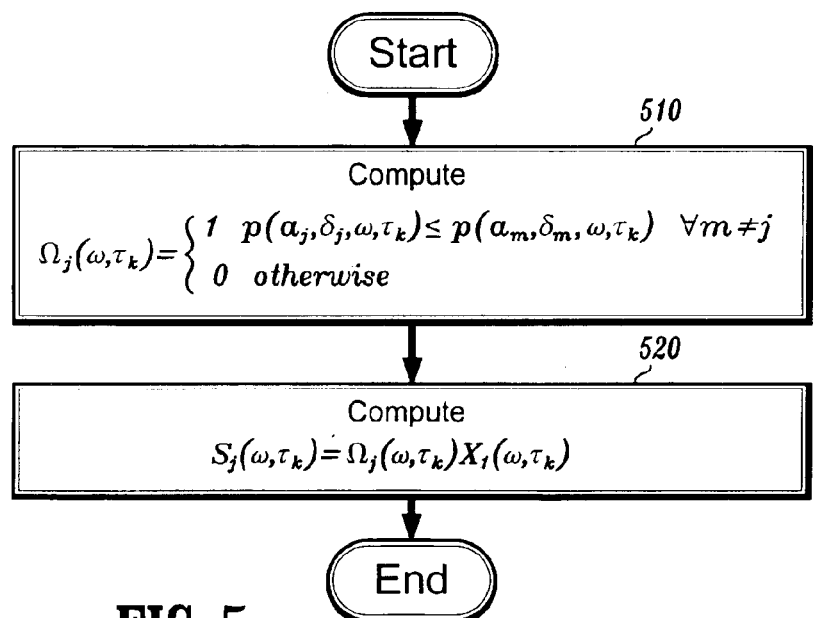
FIG. 5 is a flow diagram illustrating step 250 of the method of FIG. 2, according to an illustrative embodiment of the present invention.

FIG. 5 is a flow diagram illustrating step 240 (filter) of the method of FIG. 2, according to an illustrative embodiment of the present invention.

Using $p(\alpha_j,\delta_j,\omega,\tau_k)$ time-frequency masks are computed for the estimation of the $j^{th}$ source as follows (step 510):

$$\Omega_j(\omega,\tau_k) = \begin{cases} 1 & p(a_j,\delta_j,\omega,\tau_k) \le p(a_m,\delta_m,\omega,\tau_k) \forall m \ne j \\ 0 & \text{otherwise} \end{cases} \quad (24)$$

where $\Omega_j(\omega,\tau_k)$ is a time-frequency mask; $p(\alpha_j,\delta_j,\omega,\tau_k)$ is an error measure for a $j^{th}$ source; j and m are source indexes ranging from 1 to N, where N is a number of the multiple sources; $\tau_k$ is a current time; k is a current time index; $\alpha_j$ and $\delta_j$ are current estimates of amplitude and delay mixing parameters for the $j^{th}$ source, respectively; and $\omega$ is a frequency argument.

It is to be appreciated that, as noted above, the closer $p(\alpha_j,\delta_j,\omega,\tau_k)$ is to zero, the better it explains the time-frequency content of the mixtures, and the more likely the particular guess is the correct guess. Thus, for each time-frequency point, one of the guesses has to be the correct one, so we choose the smallest value of $p(\alpha_j,\delta_j,\omega,\tau_k)$ as it best explains the data; this is the selection done in Equation (24).

Using the time-frequency masks, the first mixture $x_1$ and the second mixture $x_2$ are filtered to obtain estimates of the (original) multiple sources as follows (step 520):

$$S_j(\omega,\tau_k) = \Omega_j(\omega,\tau_k)X_1(\omega,\tau_k) \quad (25)$$

where $S_j(\omega,\tau_k)$ is an estimate of a time-frequency representation of a $j^{th}$ source; j is a source index ranging from 1 to N, where N is a number of the multiple sources; $\Omega_j(\omega,\tau_k)$ is a time-frequency mask; $X_1(\omega,\tau_k)$ is a time-frequency representation of a first mixture of the two mixtures; $\omega$ is a frequency argument; $\tau_k$ is a current time; k is a current time index.

Thus, it is to be appreciated that at step 520, we take all the time-frequency points for which $p(\alpha_j,\delta_j,\omega,\tau_k)$ was the best match (that is, where $p(\alpha_j,\delta_j,\omega,\tau_k)$ has the smallest value, and leave these time-frequency points unaltered while we set to zero (or some low threshold) all the time-frequency pints in the mixtures for which $p(\alpha_j,\delta_j,\omega,\tau_k)$ was not the smallest. This time-frequency filtered version of the mixtures is the estimate of the time-frequency representation of the first source. We repeat this for each j=1, . . . ,N to obtain the N original source estimates. This is the filtering of Equation (25).

Figure 6:
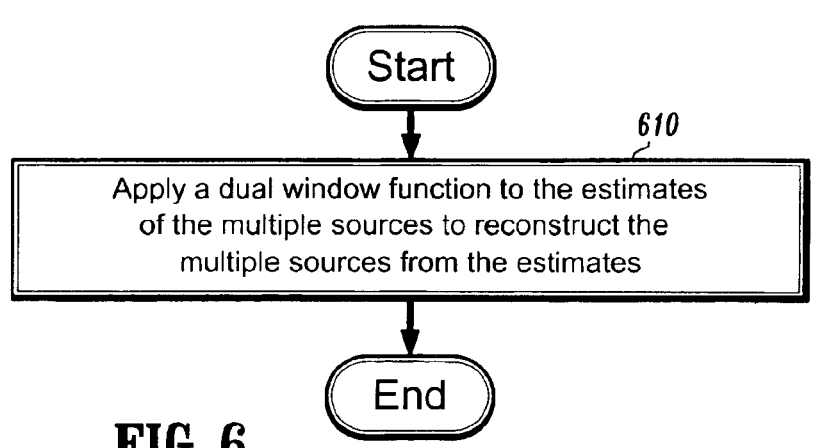
FIG. 6 is a flow diagram illustrating step 270 of the method of FIG. 2, according to an illustrative embodiment of the present invention.

FIG. 6 is a flow diagram illustrating step 260 (output estimates) of the method of FIG. 2, according to an illustrative embodiment of the present invention.

A dual window function is applied to the estimates of the (original) multiple sources obtained at step 520 of FIG. 5 to reconstruct the multiple sources from the estimates (step 610).

A description of mixing parameter estimation will now be given, according to an illustrative embodiment of the present invention. Such description will include descriptions of source mixing, source assumptions, amplitude-delay estimation, and ML mixing parameter gradient search. It is to be appreciated that, for the sake of brevity, definitions of terms appearing in the equations herein below will not be repeated; such definitions have been provided with respect to FIGS. 2–6 herein above or are readily ascertainable by one of ordinary skill in the related art.

Accordingly, source mixing, which is associated herein with mixing parameter estimation, will first be described, according to an illustrative embodiment of the present invention. Consider measurements of a pair of sensors where only the direct path is present. In this case, without loss of generality, we can absorb the attenuation and delay parameters of the first mixture, $x_1(t)$, into the definition of the sources. The two mixtures can thus be expressed as, $$x_1(t) = \sum_{j=1}^{n} s_j(t), \quad (1)$$

$$x_2(t) = \sum_{j=1}^{n} a_j s_j(t - \delta_j), \quad (2)$$

where N is the number of sources, $\delta_j$ is the arrival delay between the sensors resulting from the angle of arrival, and $\alpha_j$ is a relative attenuation factor corresponding to the ratio of the attenuations of the paths between sources and sensors. We use $\Delta$ to denote the maximal possible delay between sensors, and thus, $|\delta_j| \leq \Delta$, $\forall j$.

A description of source assumptions, which are associated herein with mixing parameter estimation, will now be given according to an illustrative embodiment of the present invention.

We call two functions $s_1(t)$ and $s_2(t)$ W-disjoint orthogonal if, for a given windowing function $W(t)$, the supports of the windowed Fourier transforms of $s_1(t)$ and $s_2(t)$ are disjoint. The windowed Fourier transform of $s_j(t)$ as defined-, $$F^W(s_j(\cdot))(\omega, \tau) = \int_{-\infty}^{\infty} W(t-\tau)s_j(t)e^{-i\omega t}dt, \quad (3)$$

which we will refer to as $S_j(\omega, \tau)$ where appropriate. The W-disjoint orthogonality assumption can be stated concisely, $$S_1(\omega,\tau)S_2(\omega,\tau)=0, \forall \omega,\tau. \quad (4)$$

In Appendix A, we introduce the notion of approximate W-disjoint orthogonality. When $W(t)=1$, we use the following property of the Fourier transform, $$F^W(s_j(\cdot-\delta))(\omega,\tau)=e^{-i\omega\delta}F^W(s_j(\cdot))(\omega,\tau) \quad (5)$$

We will assume that (5) holds for all $\delta, |\delta| \leq \Delta$, even when $W(t)$ has finite support. This assumption is further described by Balan et al., in "The Influence of Windowing on Time Delay Estimates", Proceedings of the 2000 CISS, Princeton, N.J., Mar. 15–17, 2000.

A description of amplitude-delay estimation, which is associated herein with mixing parameter estimation, will now be given according to an illustrative embodiment of the present invention. Using the above assumptions, we can write the model from (1) and (2) for the case with two array elements as, $$\begin{bmatrix} X_1(\omega, \tau) \\ X_2(\omega, \tau) \end{bmatrix} = \begin{bmatrix} 1 & \cdots & 1 \\ a_1 e^{-i\omega\delta_1} & \cdots & a_N e^{-i\omega\delta_N} \end{bmatrix} \begin{bmatrix} S_1(\omega, \tau) \\ \vdots \\ S_N(\omega, \tau) \end{bmatrix} \quad (6)$$

For W-disjoint orthogonal sources, we note that at most one of the N sources will be non-zero for a given (T, I), thus, $$\begin{bmatrix} X_1(\omega, \tau) \\ X_2(\omega, \tau) \end{bmatrix} = \begin{bmatrix} 1 \\ a_j e^{-i\omega\delta_j} \end{bmatrix} S_j(\omega, \tau), \text{ for some } j. \quad (7)$$

The original DUET algorithm estimated the mixing parameters by analyzing the ratio of $X_1(\omega,\tau)$ and $X_2(\omega,\tau)$. In light of (7), it is clear that mixing parameter estimates can be obtained via, $$(a(\omega, \tau), \delta(\omega, \tau)) = \left( \left| \frac{X_2(\omega, \tau)}{X_1(\omega, \tau)} \right|, \frac{1}{\omega} \text{Im}\left\{ \left( \ln \frac{X_1(\omega, \tau)}{X_2(\omega, \tau)} \right) \right\} \right) \quad (8)$$

The original DUET algorithm constructed in 2-D histogram of amplitude-delay estimates and looked at the number and location of the peaks in the histogram to determine the number of sources and their mixing parameters. The 2-D histogram is further described by Jourjine et al., in "Blind Separation of Disjoint Orthogonal Signals: Demixing N Sources from 2 Mixtures", in Proceedings of the 2000 IEEE International Conference on Acoustics, Speech, and Signal Processing, Istanbul, Turkey, June 2000, vol. 5, pp. 2985–88.

A description of a maximum likelihood (ML) mixing parameter gradient search, which is associated herein with mixing parameter estimation, will now be given according to an illustrative embodiment of the present invention. For the online algorithm, we take a different approach. First note that, $$|X_1(\omega,\tau)\alpha_j e^{-i\omega\delta_j} - X_2(\omega,\tau)|^2 = 0, \quad (9)$$

if source j is the active source at time-frequency $(\omega,\tau)$ Moreover, defining, $$p(a_j, \delta_j, \omega, \tau) = \frac{1}{1+a_j^2} |X_1(\omega, \tau)a_j e^{-i\omega\delta_j} - X_2(\omega, \tau)|^2 \quad (10)$$

we can see that, $$\sum_{\omega} \min(p(a_1, \delta_1, \omega, \tau), \ldots, p(a_N, \delta_N, \omega, \tau)) = 0, \quad (11)$$

because at least one $p(\alpha_j,\delta_j,\omega,\tau)$ will be zero at each frequency. In the Appendix, it is shown that the maximum likelihood estimates of the mixing parameters satisfy, $$\min_{a_1,\delta_1,\ldots,a_N,\delta_N} \sum_{\omega} \min(p(a_1, \delta_1, \omega, \tau), \ldots, p(a_N, \delta_N, \omega, \tau)). \quad (12)$$

We perform gradient descent with (12) as the objective function to learn the mixing parameters. In order to avoid the discontinuous nature of the minimum function, we approximate it smoothly as follows, $$\min(p_1, p_2) = \frac{p_1 + p_2 - |p_1 - p_2|}{2} \quad (13)$$

$$\approx \frac{p_1 + p_2 - \phi(p_1 - p_2)}{2} \quad (14)$$

$$= \frac{-1}{\lambda} \ln(e^{-\lambda p_1} + e^{-\lambda p_2}) \quad (15)$$

$$\text{where,} \quad \phi(x) = \int_0^x \frac{1 - e^{\lambda t}}{1 + e^{-\lambda t}} dt = x + \frac{2}{\lambda} \ln(1 + e^{-\lambda}) \quad (16)$$

Generalizing (15), the smooth ML objective function is, $$J(\tau) = \min_{a_1 \delta_1, \ldots, a_N, \delta} \sum_\omega -\frac{1}{\lambda} \ln(e^{-\lambda p(a_1, \delta_1, \omega, \tau)} + \cdots + e^{-\lambda p(a_N, \delta_N, \omega, \tau)}) \quad (17)$$

which has partials, $$\frac{\partial J(\tau)}{\partial \delta_j} = \sum_\omega \frac{e^{-\lambda p(a_j, \delta_j, \omega, \tau)}}{\sum_l e^{-\lambda p(a_l, \delta_l, \omega, \tau)}} \frac{-2\omega a_j}{1 + a_j^2} \text{Im}\{X_1(\omega, \tau) \overline{X_2(\omega, \tau)} e^{-i\omega \delta_j}\} \quad (18)$$

and, $$\frac{\partial J(\tau)}{\partial a_j} = \quad (19)$$

$$\sum_\omega \frac{e^{-\lambda p_j}}{\sum_k e^{-\lambda p_k}} \frac{2}{(1 + a_j^2)^2} \left( ((a_j^2 - 1) \text{Re}\{X_1(\omega, \tau) \overline{(X_2(\omega, \tau)e)}^{-i\omega \delta_j}\} + a_j(|X_1(\omega, \tau)|^2 + |X_2(\omega, \tau)|^2) \right)$$

We assume we know the number of sources we are searching for and initialize an amplitude and delay estimate pair to random values for each source. The estimates ($\alpha_j[k]$, $\delta_j[k]$) for the current time $\tau_k = k\tau_\Delta$ (where $\tau_\Delta$ is the time separating adjacent time windows) are updated based on the previous estimate and the current gradient as follows, $$a_j[k] = a_j[k-1] - \beta a_j[k] \frac{\partial J(\tau_k)}{\partial a_j} \quad (20)$$

$$\delta_j[k] = \delta_j[k-1] - \beta \delta_j[k] \frac{\partial J(\tau_k)}{\partial \delta_j} \quad (21)$$

where β is a learning rate constant and $\alpha_j[k]$ is a time and mixing parameter dependent learning rate for time index k for estimate j. In practice, we have found it helpful to adjust the learning rate depending on the amount of mixture energy recently explained by the current estimate. We define, $$q_j[k] = \sum_\omega \frac{e^{-\lambda p(a_j, \delta_j, \omega, \tau_k)}}{\sum_l e^{-\lambda p(a_l, \delta_l, \omega, \tau)}} |X_l(\omega, \tau_k)| |X_2(\omega, \tau_k)| \quad (22)$$

and update the parameter dependent learning rate as follows, $$\alpha_j[k] = \frac{q_j[k]}{\sum_{m=0}^k \gamma^{k-m} q_j[m]} \quad (23)$$

where γ is a forgetting factor.

A description of demixing will now be given, according to an illustrative embodiment of the present invention. In order to demix the $j^{th}$ source, we construct a time-frequency mask based on the ML parameter estimator (see (B) in the Appendix), $$\Omega_j(\omega, \tau) = \begin{cases} 1 & p(a_j, \delta_j, \omega, \tau) \leq p(a_m, \delta_m, \omega, \tau) \, \forall \, m \neq j \\ 0 & \text{otherwise} \end{cases} \quad (24)$$

The estimate for the time-frequency representation of the $j^{th}$ source is, $$S_j(\omega, \tau) = \Omega_j(\omega, \tau) X_1(\omega, \tau) \quad (25)$$

We then reconstruct the source using the appropriate dual window function. The preceding is further described by I. Daubechies, in "Ten Lectures on Wavelets", ch. 3, SIAM, Philadelphia, Pa., 1992. In this way, we demix all the sources by partitioning the time-frequency representation of one of the mixtures. Note that because the method does not invert the mixing matrix, it can demix all sources even when the number of sources is greater than the number of mixtures (N>M).

A description of tests performed with respect to an illustrative embodiment of the present invention will now be given. We tested the method on mixtures created in both an anechoic room and an echoic office environment. The algorithm used parameters β=0.02, γ=0.95, λ=10 and a Hamming window of size 512 samples (with adjacent windows separated by 128 samples) in all the tests. For all tests, the method ran more than 5 times faster than real time.

Figure 7:
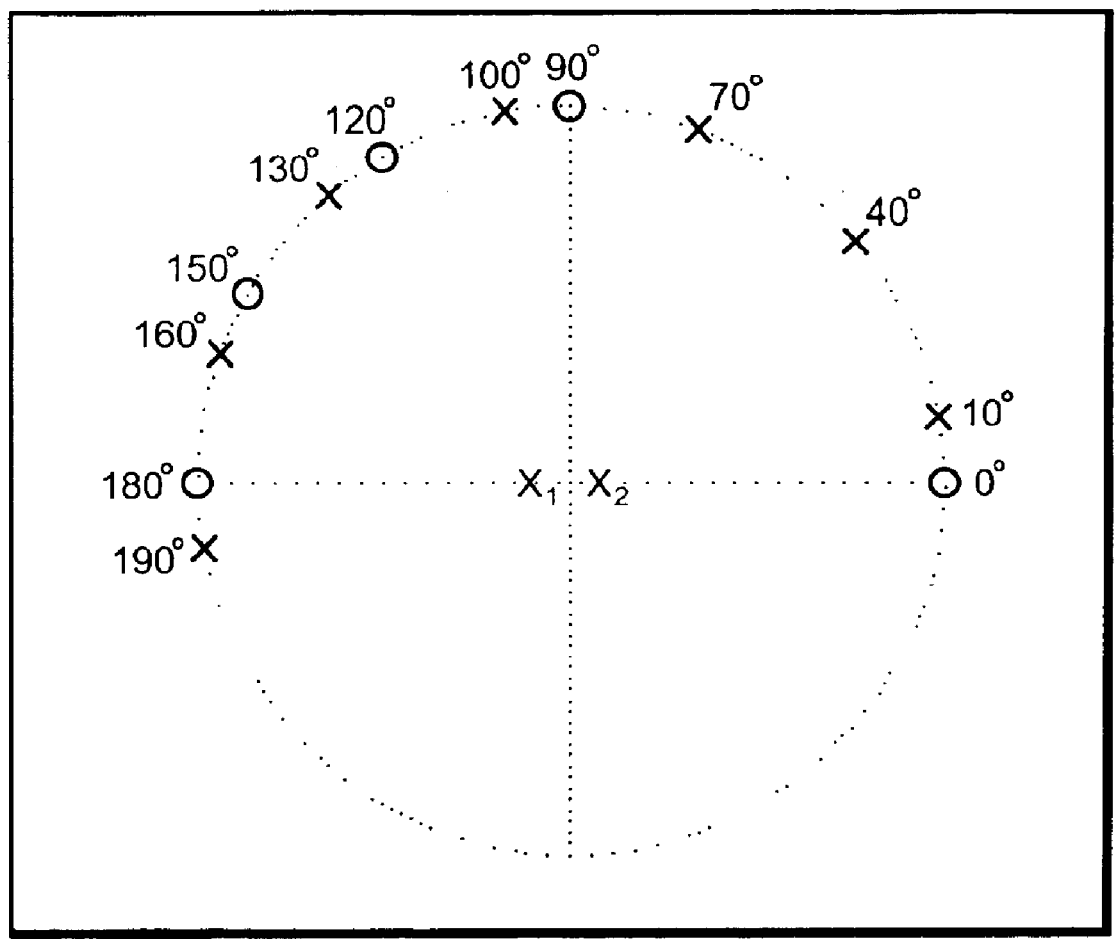
FIG. 7 is a diagram illustrating a test setup for blind source separation on anechoic data, according to an illustrative embodiment of the present invention.

FIG. 7 is a diagram illustrating a test setup for blind source separation on anechoic data, according to an illustrative embodiment of the present invention. Microphones are separated by ~1.75 cm centered along the 180 degree to 0 degree line. The X's show the source locations used in the anechoic tests. The O's show the locations of the sources in the echoic tests. Separate recordings at 16 kHz were made of six speech files (4 female, 2 male) taken from the TIMIT database played from a loudspeaker placed at the X marks in FIG. 7. Pairwise mixtures were then created from all possible voice/angle combinations, excluding same voice and same angle combinations, yielding a total of 630 mixtures (630=6×5×7×6/2).

The SNR gains of the demixtures were calculated as follows. Denote the contribution of source j on microphone k as $S_{jk}(\omega, \tau)$. Thus we have, $$X_1(\omega, \tau) = S_{11}(\omega, \tau) + S_{21}(\omega, \tau) \quad (26)$$

$$X_2(\omega, \tau) = S_{12}(\omega, \tau) + S_{22}(\omega, \tau) \quad (27)$$

As we do not know the permutation of the demixing, we calculate the SNR gain conservatively, $$SNR_1 = \max\left(10 \log \frac{\|\Omega_1 S_{11}\|^2}{\|\Omega_1 S_{21}\|^2}, 10 \log \frac{\|\Omega_2 S_{12}\|^2}{\|\Omega_2 S_{22}\|^2}\right) - \max\left(10 \log \frac{\|S_{11}\|^2}{\|S_{21}\|^2}, 10 \log \frac{\|S_{12}\|^2}{\|S_{22}\|^2}\right)$$

$$SNR_2 = -\min\left(10 \log \frac{\|\Omega_1 S_{11}\|^2}{\|\Omega_1 S_{21}\|^2}, 10 \log \frac{\|\Omega_2 S_{12}\|^2}{\|\Omega_2 S_{22}\|^2}\right) + \min\left(10 \log \frac{\|S_{11}\|^2}{\|S_{21}\|^2}, 10 \log \frac{\|S_{12}\|^2}{\|S_{22}\|^2}\right)$$

In order to give the method time to learn the mixing parameters, the SNR results do not include the first half second of data.

Figure 8:
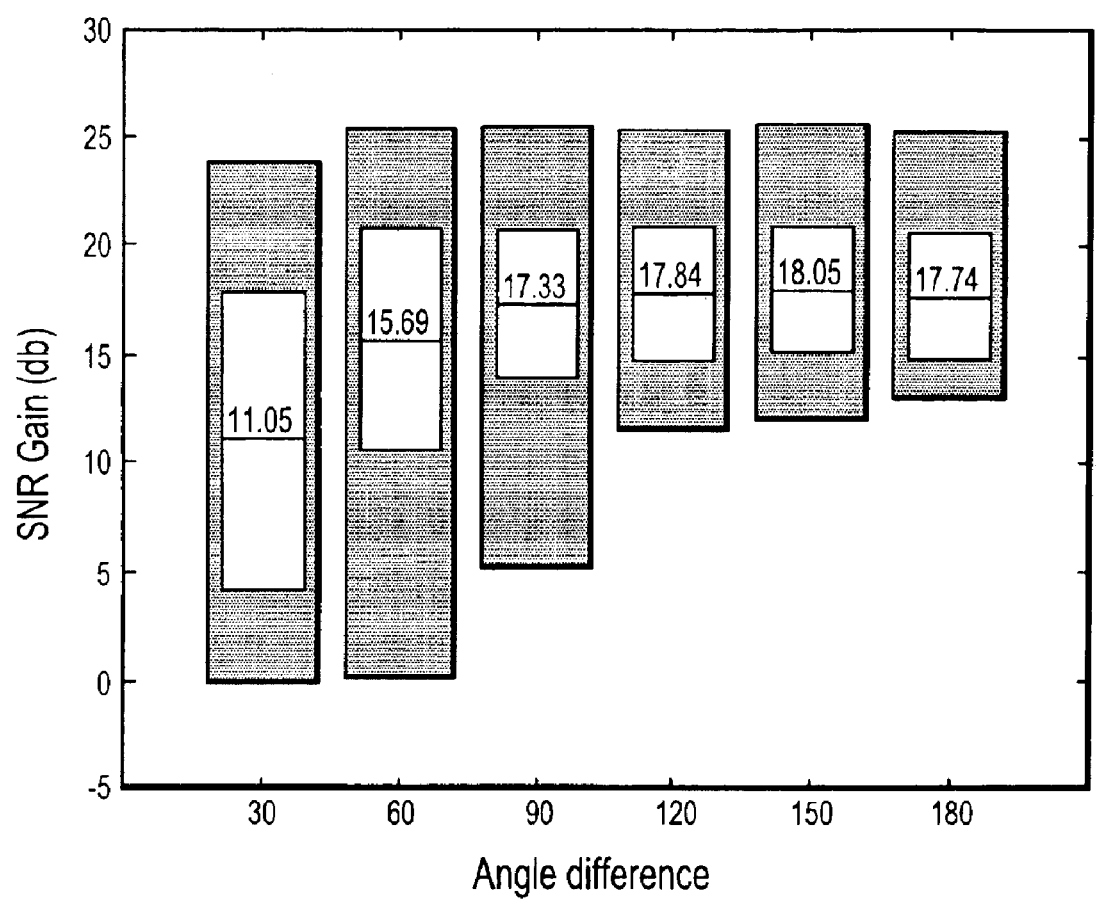
FIG. 8 is a diagram illustrating a comparison of overall separation SNR gain by angle difference for the anechoic data, according to an illustrative embodiment of the present invention.
Figure 9:
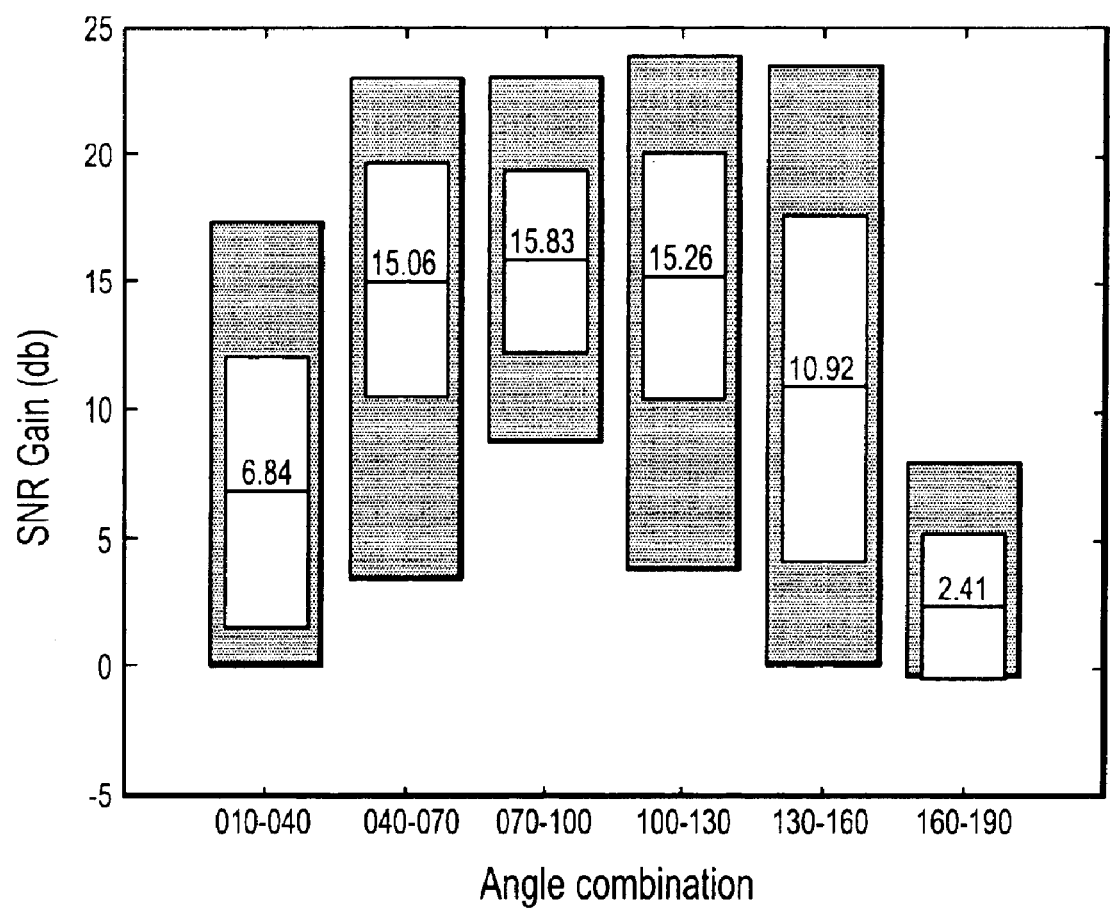
FIG. 9 is a diagram illustrating the overall separation SNR gain by 30 degree angle pairing for the anechoic data, according to an illustrative embodiment of the present invention.

FIG. 8 is a diagram illustrating the average SNR gain results for each angle difference for the anechoic data, according to an illustrative embodiment of the present invention. That is, FIG. 8 illustrates a comparison of overall separation SNR gain by angle difference, according to an illustrative embodiment of the present invention. As an example, the 60 degree difference results average all the 10–70, 40–100, 70–130, 100–160, and 130–190 results. Each bar shows the maximum SNR gain, one standard deviation above the mean, the mean (which is labeled), one standard deviation below the mean, and the minimum SNR gain over all the tests (both $SNR_1$ and $SNR_2$ are included in the averages). The separation results improve as the angle difference increases. FIG. 9 is a diagram illustrating the 30 degree difference results by angle comparison for the anechoic data, averaging 30 tests per angle comparison, according to an illustrative embodiment of the present invention. That is, FIG. 9 illustrates the overall separation SNR gain by 30 degree angle pairing, according to an illustrative embodiment of the present invention. The performance is a function of the delay. That is, the worst performance is achieved for the smallest delay (corresponding to the 10–40 mixtures), and so forth.

Figure 10:
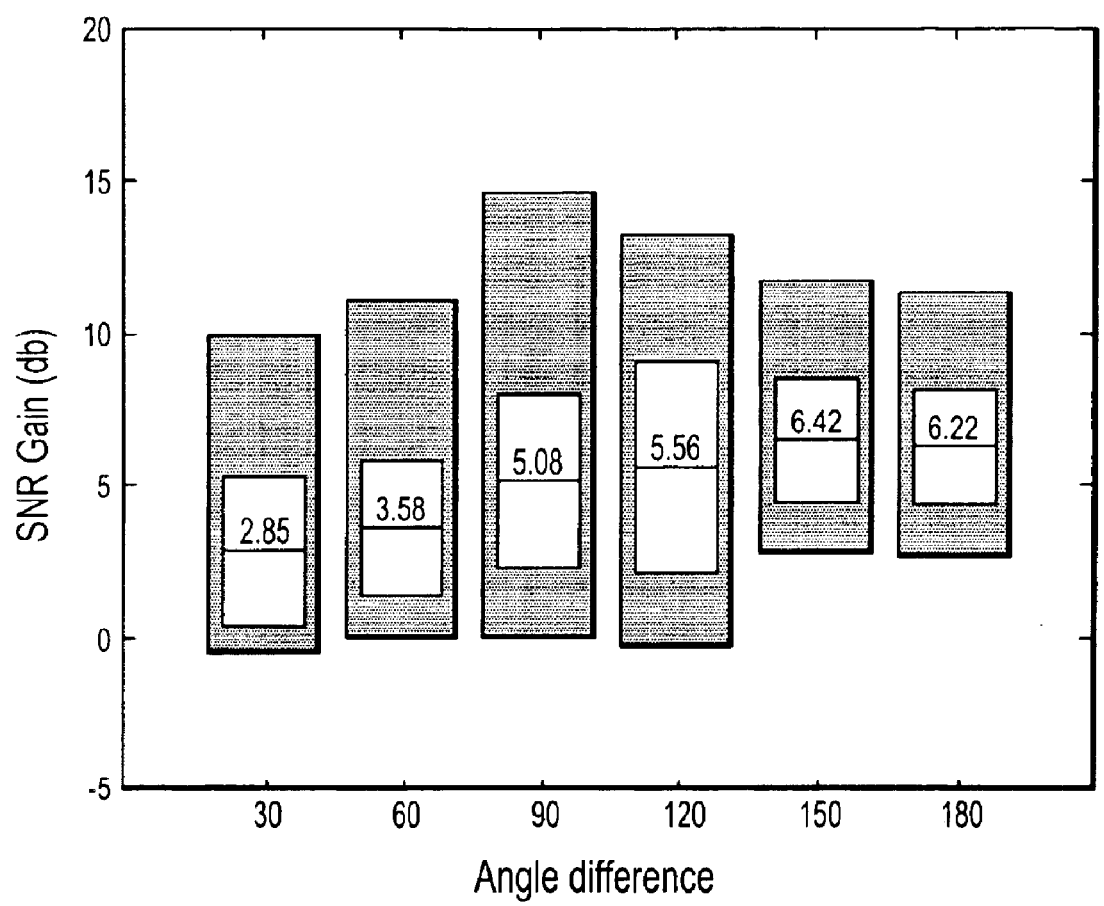
FIG. 10 is a diagram illustrating a comparison of overall separation SNR gain by angle difference, using echoic office data in a voice versus noise comparison, according to an illustrative embodiment of the present invention.
Figure 11:
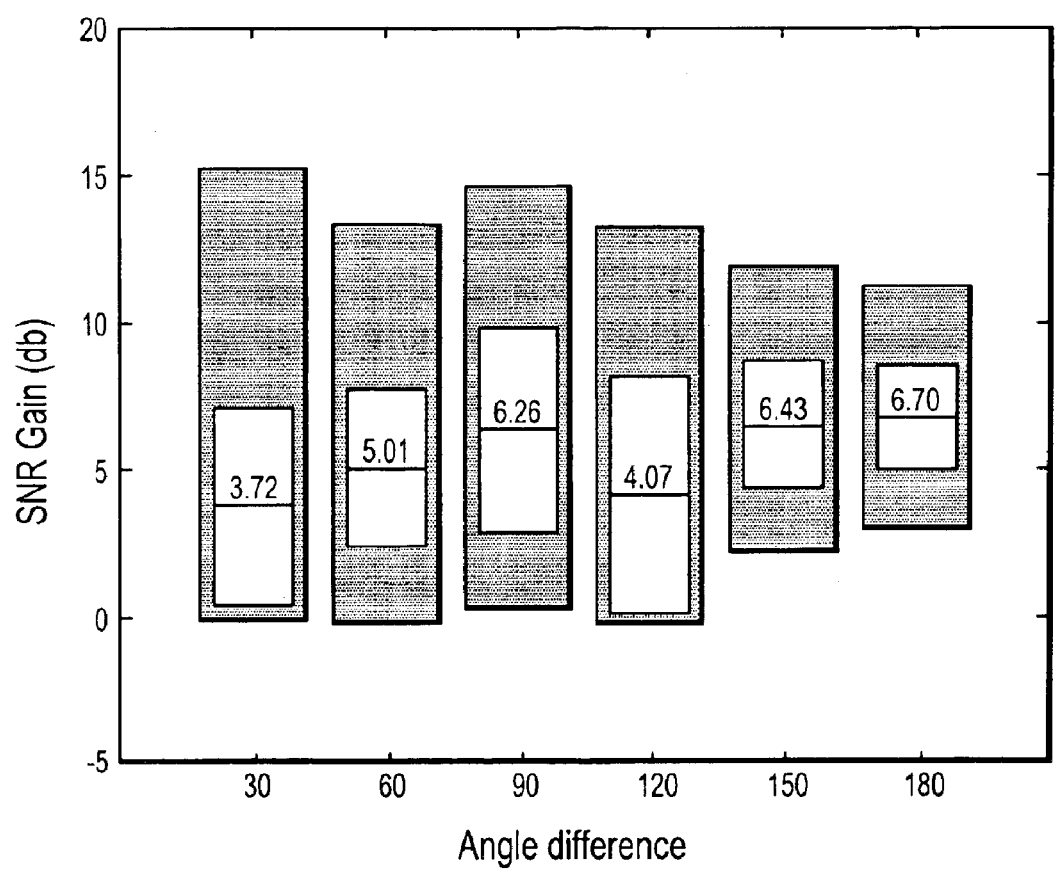
FIG. 11 is a diagram illustrating separation results for pairwise mixtures of voices, according to an illustrative embodiment of the present invention.

Recordings were also made in an echoic office with reverberation time of ~500 ms, that is, the impulse response of the room fell to −60 dB after 500 ms. For the echoic tests, the sources were placed at 0, 90, 120, 150, and 180 degrees (see the O's in FIG. 7). FIG. 11 is a diagram illustrating separation results for pairwise mixtures of voices (4 female, 4 male), according to an illustrative embodiment of the present invention. Separation results for pairwise mixtures of voices (4 female, 4 male) and noises (line printer, copy machine, and vacuum cleaner) are shown in FIG. 10. That is, FIG. 10 is a diagram illustrating a comparison of overall separation SNR gain by angle difference, using echoic office data in a voice versus noise comparison, according to an illustrative embodiment of the present invention. The results are considerably worse in the echoic case, which is not surprising as the method assumes anechoic mixing. However, the method does achieve 5 dB SNR gain on average and is real-time.

TABLE 1

|  | AVV | EVV | EVN |
|---|---|---|---|
| Number of tests | 630 | 560 | 480 |
| Mean SNR gain (dB) | 15.31 | 5.09 | 4.41 |
| Std SNR gain (dB) | 5.69 | 3.34 | 2.87 |
| Max SNR gain (dB) | 25.65 | 15.18 | 14.61 |
| Min SNR gain (dB) | −0.21 | −0.42 | −0.50 |

Summary results for all three testing groups (anechoic, echoic voice vs. voice, and echoic voice vs. noise) are shown in the Table 1. In the table, the following designations are employed: AVV=Anechoic Voice vs. Voice; EVV=Echoic Voice vs. Voice; and EVN=Echoic Voice vs. Noise. We have presented a real-time version of the DUET algorithm that uses gradient descent to learn the anechoic mixing parameters and then demixes by partitioning the time-frequency representations of the mixtures. We have also introduced a measure of W-disjoint orthogonality and provided empirical evidence for the approximate W-disjoint orthogonality of speech signals.

Appendix A

Figure 12:
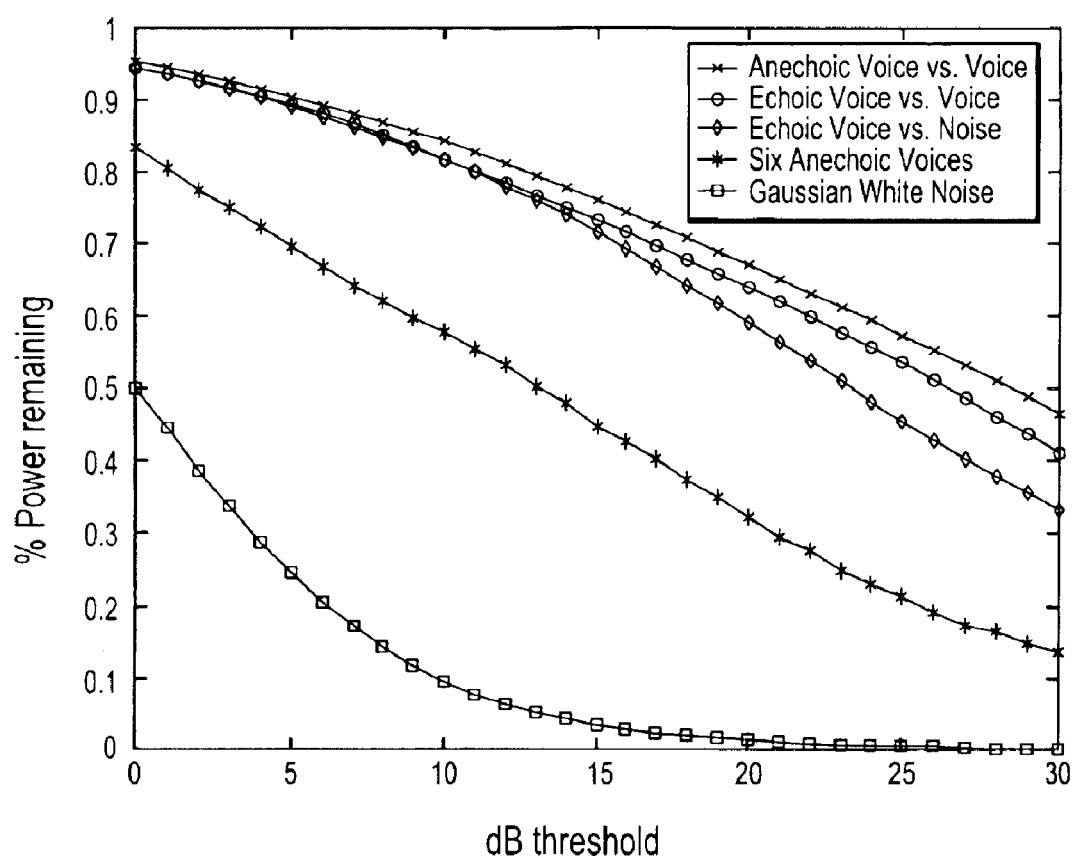
FIG. 12 is a diagram illustrating W-disjoint orthogonality for various sources, according to an illustrative embodiment of the present invention.

Appendix A describes the justification for the W-disjoint orthogonality of speech assumption employed herein, according to an illustrative embodiment of the present invention. Clearly, the W-disjoint orthogonality assumption is not exactly satisfied for our signals of interest. We introduce here a measure of W-disjoint orthogonality for a group of sources and show that speech signals are indeed nearly W-disjoint orthogonal to each other. Consider the time-frequency mask, $$\Phi_x^{12}(\omega, \tau) = \begin{cases} 1 & 20\log(|S_1(\omega, \tau)|/|S_2(\omega, \tau)|)x \\ 0 & \text{otherwise} \end{cases} \tag{28}$$

and the resulting energy ratio, $$r(x) = \|\Phi_x^{12}(\omega,\tau)S_1(\omega,\tau)\|^2/\|S_1(\omega,\tau)\|^2 \tag{29}$$

which measures the percentage of energy of source 1 for time-frequency points where it dominates source 2 by x dB. We propose r(x) as a measure of W-disjoint orthogonality. For example, FIG. 12 shows r(x) averaged for pairs of sources used in the demixing tests. We can see from the graph that r(3)>0.9 for all three, and thus say that the signals used in the tests were 90% W-disjoint orthogonal at 3 dB. If we can correctly map time-frequency points with 3 dB or more single source dominance to the correct corresponding output partition, we can recover the 90% of the energy of the original sources. FIG. 12 also demonstrates the W-disjoint orthogonality of six speech signals taken as a group and the fact that independent Gaussian white noise processes are less than 50% W-disjoint orthogonal at all levels.

Appendix B

Appendix B describes the ML Estimation for the DUET Model employed herein, according to an illustrative embodiment of the present invention. Assume a mixing model of type (1)–(2) to which we add measurement noise:

$$X_1(\omega, \tau) = \sum_{j=1}^{N} q_j(\omega, \tau)S_j(\omega, \tau) + v_1(\omega, \tau) \tag{30}$$

$$X_2(\omega, \tau) = \sum_{j=1}^{N} a_j e^{-i\omega\delta_j} q_j(\omega, \tau)S_j(\omega, \tau) + v_2(\omega, \tau) \tag{31}$$

The ideal model (1)–(2) is obtained in the limit $v_1, v_2 \to 0$. In practice, we make the computations assuming the existence of such a noise, and then we pass to the limit. We assume the noise and source signals are Gaussian distributed and independent from one another, with zero mean and known variances:

$$\begin{bmatrix} v_1(\omega, \tau) \\ v_2(\omega, \tau) \end{bmatrix} \sim N(0, \sigma^2 I_2)$$

$$S_j(\omega,\tau) \sim N(0, p_j(\omega))$$

The Bernoulli random variables $q_j(\omega,\tau)$'s are NOT independent. To accommodate the W-disjoint orthogonality assumption, we require that for each $(\omega,\tau)$ at most one of the $q_j(\omega,\tau)$'s can be unity, and all others must be zero. Thus the N-tuple $(q_1(\omega,\tau), \ldots, q_N(\omega,\tau))$ takes values only in the set $$Q = \{(0, 0, \ldots, 0), (1, 0, \ldots, 0), \ldots, (0, 0, \ldots, 1)\}$$

of cardinality N+1. We assume uniform priors for these R.V.'s.

The short-time stationarity implies different frequencies are decorrelated (and hence independent) from one another. We use this property in constructing the likelihood. The likelihood of parameters $(\alpha_1, \delta_1, \ldots, \alpha_N, \delta_N)$ given the data $(X_1(\omega,\tau), X_2(\omega,\tau))$ and spectral powers $\sigma^2, p_j(\omega)$ at a given $\tau$, is given by conditioning with respect to $q_j(\omega,\tau)$'s by:

$$L(a_1, \delta_1, \ldots, a_N, \delta_N; \tau) :=\quad (32)$$

$$p(X_1(\cdot), X_2(\cdot) \mid a_1, \delta_1, \ldots, a_N, \delta_N; \tau, \sigma^2, p_j)$$

$$= \prod_\omega \sum_{j=0}^{N} \frac{\exp\{-M\}}{\pi^2 \det(\sigma^2 I_2 + p_j(\omega)\Gamma_j(\omega))} p(q_j(\omega, \tau) = 1)$$

where:

$$M = [\overline{X_1(\omega, \tau)}\ \overline{X_2(\omega, \tau)}](\sigma^2 I_2 + p_j(\omega)\Gamma_j(\omega))^{-1} \begin{bmatrix} X_1(\omega, \tau) \\ X_2(\omega, \tau) \end{bmatrix} \text{ and}$$

$$\Gamma_j = \begin{bmatrix} 1 \\ a_j e^{-i\omega\delta_j} \end{bmatrix}[1\ a_j e^{i\omega\delta_j}] = \begin{bmatrix} 1 & a_j e^{i\omega\delta_j} \\ a_j e^{-i\omega\delta_j} & a_j^2 \end{bmatrix}$$

and we have defined $$q_0(\omega, \tau) = \sum_{k=1}^{N} q_k(\omega, \tau),\ p_0(\omega) = 0,\ \text{and}\ \Gamma_0(\omega) = I_2$$

for notational simplicity in (32) in dealing with the case when no source is active at a given $(\omega,\tau)$.

Next, the Matrix Inversion Lemma (or an explicit computation) gives:

$$-M = -\frac{1}{\sigma^2} \frac{1}{\sigma^2 + p_j(\omega)(1 + a_j^2)}$$

$$(p_j(\omega)|a_j e^{-i\omega\delta_j} X_1(\omega, \tau) - X_2(\omega, \tau)|^2 +$$

$$\sigma^2(|X_1(\omega, \tau)|^2 + |X_2(\omega, \tau)|^2))$$

and $$\det(\sigma^2 I_2 + p_j(\omega)\Gamma_j(\omega)) = \sigma^2 + p_j(\omega)(1 + a_j^2))$$

and $$\det(\sigma^2 I_2 + p_j(\omega)\Gamma_j(\omega)) = \sigma^2 + p_j(\omega)(1+\alpha_j^2))$$

Now we pass to the limit $\sigma \to 0$. The dominant terms from the previous two equations are:

$$-\frac{1}{\sigma^2} \frac{|a_j e^{-i\omega\delta_j} X_1(\omega, \tau) - X_2(\omega, \tau)|^2}{1 + a_j^2} \quad \text{and} \quad \sigma^2 p_j(\omega)(1 + a_j^2)$$

and $$\sigma^2\ p_j(\omega)(1+\alpha_j^2)$$

Of the N+1 terms in each sum of (32), only one term is dominant, namely the one of the largest exponent. Assume $\pi : \omega \mapsto \{0,1,\ldots,N\}$ is the selection map defined by:

$$\pi(\omega)=K,\ \text{if}\ p(\alpha_k,\delta_k,\omega,\tau) \leq p(\alpha_j,\delta_j,\omega,\tau) \forall_j \neq k$$

where:

$$p(\alpha_0,\delta_0,\omega,\tau)=|X_1(\omega,\tau)|^2+|X_2(\omega,\tau)|^2$$

and for $k \in \{1,2,\ldots,N\}$:

$$p(a_k, \delta_k, \omega, \tau) = \frac{|a_j e^{-i\omega\delta_j} X_1(\omega, \tau) - X_2(\omega, \tau)|^2}{1 + a_j^2}$$

Then the likelihood becomes:

$$L(a_1, \delta_1, \ldots, a_N, \delta_N; \tau) = \quad (33)$$

$$\frac{C}{\sigma^{2M}} \prod_{k=0}^{N} \prod_{\omega \in \pi^{-1}(k)} t_k \exp\left\{-\frac{p(a_k, \delta_k, \omega, \tau)}{\sigma^2}\right\}$$

with M, the number of frequencies and:

$$t_k = \begin{cases} \dfrac{1}{\sigma^2} & k = 0 \\ \dfrac{1}{p_k(\omega)(1 + a_k^2)} & k \in \{1, 2, \ldots, N\} \end{cases}$$

The dominant term in log-likelihood remains the exponent. Thus:

$$\log L \approx -\frac{1}{\sigma^2} \sum_{k=0}^{N} \sum_{\omega \in \pi^{-1}(k)} p(a_k, \delta_k, \omega, \tau) \quad (34)$$

and maximizing the log-likelihood is equivalent to the following (which is (12)):

$$\min_{a_1, \delta_1, \ldots, a_N, \delta_N} \sum_\omega \min(p(a_1, \delta_1, \omega, \tau), \ldots, p(a_N, \delta_N, \omega, \tau))$$

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for blind source separation of multiple sources, comprising:
   detecting the multiple sources using an array of sensors to obtain data representative of the multiple sources;
   representing the data by two mixtures having estimates of amplitude and delay mixing parameters;
   updating the estimates of amplitude and delay mixing parameters, comprising the steps of:
      calculating a plurality of error measures, each of the plurality of error measures indicating a closeness of the estimates of amplitude and delay mixing parameters for a given source to a given time-frequency point in the two mixtures; and
      revising the estimates of amplitude and delay mixing parameters, based on the plurality of error measures;
   filtering the two mixtures to obtain estimates of the multiple sources, comprising the steps of:
      selecting one of the plurality of error measures having a smallest value in relation to any other of the plurality of error measures, for each of a plurality of time-frequency points in the mixtures; and
      leaving unaltered any of the plurality of time-frequency points in the mixtures for which a given one of the plurality of error measures has the smallest value, while setting to zero any other of the plurality of time-frequency points in the mixtures for which the given one of the plurality of error measures does not have the smallest value, for each of the plurality of error measures;

outputting the estimates of the multiple sources.

2. The method of claim 1, wherein said step of representing the data by two mixtures comprises the step of computing a first mixture x1 and a second mixture x2 as follows:

$$x_1(t) = \sum_{j=1}^{N} s_j(t),$$

$$x_2(t) = \sum_{j=1}^{N} a_j s_j(t - \delta_j),$$

where N is a number of the multiple sources; $\delta_j$ is an arrival delay between the array of sensors resulting from an angle of arrival; $\alpha_j$ is a relative attenuation factor corresponding to a ratio of attenuations of paths between the multiple sources and the array of sensors; $s_j(t)$ is a $j^{th}$ source; j is a source index ranging from 1 to N, where N is a number of the multiple sources; and t is a time argument.

3. The method of claim 1, wherein said step of calculating the plurality of error measures comprises the step of computing $$p(a_j, \delta_j, \omega, \tau_k) = \frac{1}{1 + a_j^2} \left| X_1(\omega, \tau_k) a_j e^{-i\omega\delta_j} - X_2(\omega, \tau_k) \right|^2$$

where $p(\alpha_j, \delta_j, \omega, \tau_k)$ is an error measure for a $j^{th}$ source; $\alpha_j$ and $\delta_j$ are current estimates of amplitude and delay mixing parameters, respectively; $X_1(\omega, \tau_k)$ and $X_2(\omega, \tau_k)$ are time-frequency representations of a first mixture and a second mixture of the two mixtures, respectively; k is a current time index; $\tau_k$ is a time argument corresponding to a $k^{th}$ time index; $\omega$ is a frequency argument; and j is a source index ranging from 1 to N, where N is a number of the multiple sources.

4. The method of claim 1, wherein said step of revising the estimates of amplitude and delay mixing parameters comprises the step of computing a magnitude and a direction of change for each of the estimates of amplitude and delay mixing parameters.

5. The method of claim 4, wherein said step of computing the direction of change for each of the estimates of amplitude mixing parameters comprises the step of computing $$\frac{\partial J(\tau_k)}{\partial a_j} = \sum_{\omega} \frac{e^{-\lambda p(a_j, \delta_j, \omega, \tau_k)}}{\sum_l e^{-\lambda p(a_l, \delta_l, \omega, \tau_k)}} \frac{2}{(1 + a_j^2)^2}$$

$$\left( ((a_j^2 - 1) \text{Re}\{X_1(\omega, \tau_k) \overline{X_2(\omega, \tau_k)} e^{-i\omega\delta_j}\} + a_j (|X_1(\omega, \tau_k)|^2 + |X_2(\omega, \tau_k)|^2) \right)$$

where $\frac{\partial J(\tau_k)}{\partial a_j}$ represents the magnitude and the direction of change in a current estimate of amplitude mixing parameter for a $j^{th}$ source that causes a largest change in correspondence between the current estimate and the data; k is a current time index; $\tau_k$ is a time argument corresponding to a $k^{th}$ time index; $\alpha_j$ is the current estimate of amplitude mixing parameter for the $j^{th}$ source; $\delta_j$ is a current estimate of delay mixing parameter for the $j^{th}$ source; $X_1(\omega, \tau_k)$ and $X_2(\omega, \tau_k)$ are time-frequency representations of a first mixture and a second mixture of the two mixtures, respectively; $\omega$ is a frequency argument; j and l are source indexes ranging from 1 to N, where N is a number of the multiple sources; $p(\alpha_j, \delta_j, \omega, \tau_k)$ is an error measure for the $j^{th}$ source; $\lambda$ is a smoothness parameter; and Re is a function that returns a real part of a complex number.

6. The method of claim 4, wherein said step of computing the direction of change for each of the estimates of delay mixing parameters comprises the step of computing $$\frac{\partial J(\tau_k)}{\partial \delta_j} = \sum_{\omega} \frac{e^{-\lambda p(a_j, \delta_j, \omega, \tau_k)}}{\sum_l e^{-\lambda p(a_l, \delta_l, \omega, \tau_k)}} - 2\omega \frac{a_j}{1 + a_j^2}$$

$$\text{Im}\{X_1(\omega, \tau_k) \overline{X_2(\omega, \tau_k)} e^{-i\omega\delta_j}\}$$

where $\frac{\partial J(\tau_k)}{\partial \delta_j}$ represents the magnitude and the direction of change in a current estimate of delay mixing parameter for a $j^{th}$ source that causes a largest change in correspondence between the current estimate and the data; k is a current time index; $\tau_k$ is a time argument corresponding to a $k^{th}$ time index; $\alpha_j$ is a current estimate of amplitude mixing parameter for the $j^{th}$ source; $\delta_j$ is the current estimate of delay mixing parameter for the $j^{th}$ source; $X_1(\omega, \tau_k)$ and $X_2(\omega, \tau_k)$ are time-frequency representations of a first mixture and a second mixture of the two mixtures, respectively; $\omega$ is a frequency argument; j and l are source indexes ranging from 1 to N, where N is a number of the multiple sources; $p(\alpha_j, \delta_j, \omega, \tau_k)$ is an error measure for the $j^{th}$ source; $\lambda$ is a smoothness parameter; and Im is a function that returns an imaginary part of a complex number.

7. The method of claim 4, wherein said step of revising the estimates of amplitude and delay mixing parameters comprises the step of computing $$a_j[k] = a_j[k-1] - \beta a_j[k] \frac{\partial J(\tau_k)}{\partial a_j}$$

$$\delta_j[k] = \delta_j[k-1] - \beta \delta_j[k] \frac{\partial J(\tau_k)}{\partial \delta_j}$$

where $a_j[k]$ and $\delta_j[k]$ are the estimates of amplitude and delay mixing parameters for a $j^{th}$ source at a time index k, respectively; $\beta$ is a learning rate constant;

$$\frac{\partial J(\tau_k)}{\partial a_j}$$

represents the magnitude and the direction of change in a current estimate of amplitude mixing parameter for a $j^{th}$ source that causes a largest change in correspondence between the current estimate and the data;

$$\frac{\partial J(\tau_k)}{\partial \delta_j}$$

represents the magnitude and the direction of change in a current estimate of delay mixing parameter for a $j^{th}$ source that causes a largest change in correspondence between the current estimate and the data; $\tau_k$ is a current time; k is a current time index; and j is a source index ranging from 1 to N, wherein N is a number of the multiple sources.

8. The method of claim 4, wherein said step of computing the magnitude of change for each of the estimates of amplitude and delay mixing parameters comprises the step of scaling the magnitude of change by a learning rate constant and a variable learning rate.

9. The method of claim 8, wherein said step of computing the learning rate constant comprises the step of computing $$q_j[k] = \sum_\omega \frac{e^{-\lambda p(a_j,\delta_j,\omega,\tau_k)}}{\sum_l e^{-\lambda p(a_l,\delta_l,\omega,\tau_k)}} |X_1(\omega,\tau_k)| |X_2(\omega,\tau_k)|$$

where $q_j[k]$ represents an amount of mixture energy that is defined by estimates of amplitude and delay mixing parameters for a $j^{th}$ source; k is a current time index; $\tau_k$ is a time argument corresponding to a $k^{th}$ time index; $\alpha_j$ and $\delta_j$ are current estimates of amplitude and delay mixing parameters, respectively for the $j^{th}$ source; $X_1(\omega,\tau_k)$ and $X_2(\omega,\tau_k)$ are time-frequency representations of a first mixture and a second mixture of the two mixtures, respectively; $\omega$ is a frequency argument; j and l are source indexes ranging from 1 to N, where N is a number of the multiple sources; and $\lambda$ is a smoothness parameter.

10. The method of claim 8, wherein said step of computing the variable learning rate comprises the step of computing $$a_j[k] = \frac{q_j[k]}{\sum_{m=0}^{k} \gamma^{k-m} q_j[m]}$$

where $\alpha_j[k]$ represents the variable learning rate; $q_j[k]$ represents an amount of mixture energy that is defined by estimates of amplitude and delay mixing parameters for a $j^{th}$ source; $\gamma$ is a forgetting factor; m is a time index ranging from 0 to a current time index k; and j is a source index ranging from 1 to N, where N is a number of the multiple sources.

11. The method of claim 1, wherein said step of selecting one of the plurality of measures comprises the step of computing $$\Omega_j(\omega,\tau_k) = \begin{cases} 1 & p(a_j,\delta_j,\omega,\tau_k) \le p(a_m,\delta_m,\omega,\tau_k) \, \forall \, m \ne j \\ 0 & \text{otherwise} \end{cases}$$

where $\Omega_j(\omega,\tau_k)$ is a time-frequency mask; $p(\alpha_j,\delta_j,\omega,\tau_k)$ is an error measure for a $j^{th}$ source; j and m are source indexes ranging from 1 to N, where N is a number of the multiple sources; $\tau_k$ is a current time; k is a current time index; $\alpha_j$ and $\delta_j$ are current estimates of amplitude and delay mixing parameters for the $j^{th}$ source, respectively; and so is a frequency argument.

12. The method of claim 1, wherein said leaving and setting steps comprise the step of computing $$S_j(\omega,\tau_k) = \Omega_j(\omega,\tau_k) X_1(\omega,\tau_k)$$

where $S_j(\omega,\tau_k)$ is an estimate of a time-frequency representation of a $j^{th}$ source; j is a source index ranging from 1 to N, where N is a number of the multiple sources; $\Omega_j(\omega,\tau_k)$ is a time-frequency mask; $X_1(\omega,\tau_k)$ is a time-frequency representation of a first mixture of the two mixtures; $\omega$ is a frequency argument; $\tau_k$ is a current time; and k is a current time index.

13. The method of claim 1, wherein said step of selecting one of the plurality of measures comprise the step of constructing a time-frequency mask based on a maximum likelihood parameter estimation.

14. The method of claim 13, wherein said step of constructing the time-frequency mask comprises the step of computing $$\Omega_j(\omega,\tau_k) = \begin{cases} 1 & p(a_j,\delta_j,\omega,\tau_k) \le p(a_m,\delta_m,\omega,\tau_k) \, \forall \, m \ne j \\ 0 & \text{otherwise} \end{cases}$$

where $\Omega_j(\omega,\tau_k)$ is a time-frequency mask; $p(\alpha_j,\delta_j,\omega,\tau_k)$ is an error measure for a $j^{th}$ source; j and m are source indexes ranging from 1 to N, wherein N is a number of the multiple sources; $\tau_k$ is a current time; k is a current time index; $\alpha_j$ and $\delta_j$ are current estimates of amplitude and delay mixing parameters for the $j^{th}$ source, respectively; and $\omega$ is a frequency argument.

15. The method of claim 1, wherein said leaving and setting steps comprise the step of computing estimates for time-frequency representations of each of the multiple sources.

16. The method of claim 15, wherein said step of computing the estimates for time-frequency representations comprises the step of computing an estimate for a $j^{th}$ source of the multiple sources as follows:

$$S_j(\omega,\tau_k) = \Omega_j(\omega,\tau_k) X_1(\omega,\tau_k)$$

where $S_j(\omega,\tau_k)$ is an estimate of a time-frequency representation of a $j^{th}$ source; j is a source index ranging from 1 to N, where N is a number of the multiple sources; $\Omega_j(\omega,\tau_k)$ is a time-frequency mask; $X_1(\omega,\tau_k)$ is a time-frequency representation of a first mixture of the two mixtures; $\omega$ is a frequency argument; $\tau_k$ is a current time; k is a current time index.

17. The method of claim 1, wherein said filtering step comprises the step of partitioning a time-frequency representation of one of the two mixtures to demix all of the multiple sources.

18. The method of claim 1, wherein said outputting step comprises the step of reconstructing the multiple sources using a dual window function applied to the estimates.

19. The method of claim 1, further comprising the step of computing a frequency domain representation for the two mixtures, prior to said updating step.

20. The method of claim 1, further comprising the step of computing a time domain representation for the estimates of the multiple sources, prior to said outputting step.

21. The method of claim 1, wherein said method is implemented by a program storage device readable by machine, tangibly embodying a program of instructions executable by the machine to perform said method steps.

* * * * *